(12) United States Patent
Reznicek et al.

(10) Patent No.: US 11,605,673 B2
(45) Date of Patent: Mar. 14, 2023

(54) DUAL RESISTIVE RANDOM-ACCESS MEMORY WITH TWO TRANSISTORS

(71) Applicant: International Business Machines Corporation, Armonk, NY (US)

(72) Inventors: Alexander Reznicek, Troy, NY (US); Tsung-Sheng Kang, Ballston Lake, NY (US); Takashi Ando, Eastchester, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 17/116,147

(22) Filed: Dec. 9, 2020

(65) Prior Publication Data

US 2022/0181388 A1    Jun. 9, 2022

(51) Int. Cl.
*H01L 27/24*     (2006.01)
*H01L 27/092*    (2006.01)
*H01L 45/00*     (2006.01)

(52) U.S. Cl.
CPC ...... *H01L 27/2454* (2013.01); *H01L 27/0924* (2013.01); *H01L 45/1206* (2013.01); *H01L 45/1253* (2013.01); *H01L 45/14* (2013.01); *H01L 45/1608* (2013.01)

(58) Field of Classification Search
CPC ............ H01L 27/2454; H01L 27/0924; H01L 45/1206; H01L 45/1253; H01L 45/14; H01L 45/1608; H01L 27/2436; H01L 29/66795; H01L 45/04; H01L 45/1233; H01L 45/1273; H01L 45/146; H01L 27/2472
See application file for complete search history.

(56) References Cited

U.S. PATENT DOCUMENTS

| 8,045,361 | B2 | 10/2011 | Lee |
| 9,076,523 | B2 | 7/2015 | Lee |
| 9,178,000 | B1 | 11/2015 | Nardi |
| 9,548,109 | B2 | 1/2017 | Chung |
| 9,831,288 | B2 | 11/2017 | Grenouillet |

(Continued)

OTHER PUBLICATIONS

"Patent Cooperation Treaty PCT Notification of Transmittal of the International Search Report and the Written Opinion of the International Searching Authority, or the Declaration", International application No. PCT/EP2021/084148, International filing date Dec. 3, 2021 (Mar. 12, 2021), dated Apr. 5, 2022 (May 4, 2022), 15 pages.

(Continued)

*Primary Examiner* — David Vu
(74) *Attorney, Agent, or Firm* — Alexander G. Jochym; Edward J. Wixted, III

(57) ABSTRACT

An approach to forming a semiconductor structure is provided. The semiconductor structure includes two adjacent fins on a substrate. A gate stack is on each of the two adjacent fins. The semiconductor structure includes a first source/drain on a first end of each fin of the two adjacent fins and a second source/drain on a second end of each fin of the two adjacent fins. The semiconductor structure includes a switching layer on at least the first source/drain on the first end of each fin of the two adjacent fins and a top electrode on the switching layer. A metal material over the top electrode in the semiconductor structure.

19 Claims, 14 Drawing Sheets

(56) References Cited

U.S. PATENT DOCUMENTS

| | | | |
|---|---|---|---|
| 10,269,869 | B1 | 4/2019 | Ando |
| 10,374,039 | B1 | 8/2019 | Hashemi |
| 10,403,717 | B2 * | 9/2019 | Lee .................... H01L 29/0653 |
| 10,510,861 | B1 * | 12/2019 | Yeh ..................... H01L 29/515 |
| 10,847,720 | B1 | 11/2020 | Loy |
| 2014/0217517 | A1 | 8/2014 | Cai |
| 2018/0097001 | A1 * | 4/2018 | Bi ..................... H01L 29/66795 |

OTHER PUBLICATIONS

Burr et al., "Experimental Demonstration and Tolerancing of a Large-scale Neural Network (165 000 synapses) Using Phase-Change Memory As the Synaptic Weight Element," IEEE Transactions on Electron Devices, vol. 62, No. 11, Nov. 2015, pp. 1-10.

Gokmen et al.,"Acceleration of deep neural network training with resistive cross-point devices: design considerations," Frontiers in Neuroscience, vol. 10, 2016, doi:0.3389/fnins.2016.00333, pp. 1-13 <www.frontiersin.org>.

Kaplan et al., "A resistive CAM processing-in-storage architecture for DNA sequence alignment." IEEE Micro, vol. 37, No. 4, 2017, pp. 1-9, <www.computer.org/micro>.

Pan et al., "1Kbit FinFET Dielectric (FIND) RRAM in Pure 16nm FinFET CMOS Logic Process," 2015 IEEE International Electron Devices Meeting (IEDM), Washington, DC, 2015, pp. 1-4, doi: 10.1109/IEDM.2015.7409670.

* cited by examiner

DUAL RESISTIVE RANDOM-ACCESS MEMORY WITH TWO TRANSISTORS

BACKGROUND

The present application relates to a semiconductor structure and a method of forming the same. More particularly, the present application relates to a semiconductor structure that includes a two electrically connected resistive random-access memory (ReRAM) formed on the source/drains of two fin field effect transistors.

Many modern-day electronic devices contain electronic memory. Electronic memory may be volatile memory or non-volatile memory. Non-volatile memory retains its stored data in the absence of power, whereas volatile memory loses its stored data when power is lost.

Resistive random-access memory (ReRAM or RRAM) is one promising candidate for the next generation of non-volatile memory due to its simple structure and its compatibility with complementary metal-oxide-semiconductor (CMOS) logic fabrication processes. Resistive random-access memory works by changing the resistance across a dielectric solid-state material. A typical ReRAM consists of a bottom electrode, a top electrode, and an oxide layer between the two electrodes.

SUMMARY

According to one embodiment of the present invention, a semiconductor structure is provided that includes two adjacent fins on a substrate with a gate stack on each of the two adjacent fins. The semiconductor structure includes a first source/drain on a first end of each fin of the two adjacent fins and a second source/drain on a second end of each fin of the two adjacent fins. The semiconductor structure includes a switching layer on at least the first source/drain on the first end of each fin of the two adjacent fins and a top electrode on the switching layer. A metal material over the top electrode in the semiconductor structure.

According to another embodiment of the present invention, a method of forming a pair of resistive random-access devices on a pair of adjacent fins is provided. The method includes depositing a gate on a portion of each of a pair of adjacent fins and on a first portion of an oxide layer. The method includes forming a source/drain on each end of each fin of the pair of adjacent fins and depositing a layer of a first layer of an interlayer dielectric material. The method further includes selectively etching a portion of the first layer of interlayer dielectric material that is over at least a pair of first source/drains on a first end of each fin of the pair of adjacent fins. The method includes depositing a layer of a switching material over the first layer of interlayer dielectric, over exposed portions of the oxide layer, and over the pair of first source/drains. Additionally, the method includes depositing a top electrode material over the layer of the switching material. The method includes depositing a first metal layer over the top electrode material. Furthermore, the method includes removing a top portion of the first metal layer, a top portion of the top electrode material, and a top portion of the switching layer with a chemical-mechanical polish followed by contact formation.

BRIEF DESCRIPTION OF THE DRAWINGS

The following detailed description, given by way of example and not intend to limit the invention solely thereto, will best be appreciated in conjunction with the accompanying drawings.

DETAILED DESCRIPTION

Figure 1A:
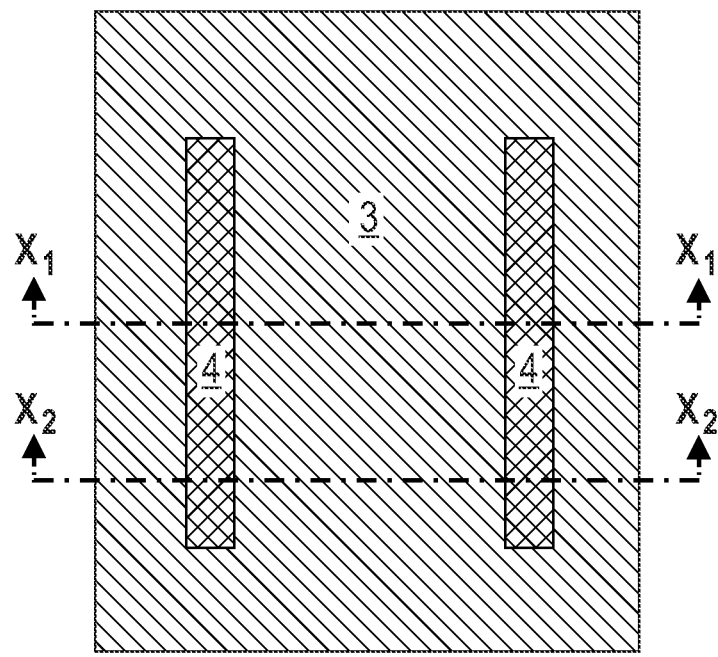
FIG. 1A is a top view illustrating a semiconductor structure according to an exemplary embodiment of the present invention.

Embodiment of the present invention recognize that resistive random-access memory (ReRAM) is a promising technology for electronic synapse devices or for a memristor in neuromorphic computing as well for use in high-density and high-speed non-volatile memory applications. In neuromorphic computing applications, a ReRAM device can be used as a connection or synapse between a pre-neuron and a post neuron that represents the connection weight using the amount of the ReRAM device resistance. Embodiments of the present invention recognize that multiple pre-neurons and multiple post neurons can be connected in an array of ReRAM devices, which naturally expresses as a fully connected neural network.

Embodiment of the present invention recognize that for online training of a deep neural network, ideally, either one bipolar ReRAM device with symmetric switching or two unipolar ReRAM devices with linear switching can be used to determine a differential weight. Embodiments of the present invention recognize that a bipolar ReRAM device with symmetric switching does not exist. Embodiment of the present invention recognize that using two unipolar ReRAM devices with linear switching requires more devices and more periphery circuits to represent a weight in the training of the deep neural network and, therefore, using two unipolar ReRAM devices with linear switching requires significant semiconductor real estate or area.

Additionally, embodiments of the present invention recognize that electroforming of a current conducting filament in an oxide of a ReRAM device occurs. Currently, the location of the conducting filament formed in an oxide of a ReRAM device is not controlled. When the location of the current conducting filament is not controlled, a higher voltage to form the filament in the ReRAM may be needed as the ReRAM cell is scaled, resulting a high ReRAM device variability.

Embodiments of the present invention relate generally to a semiconductor structure and a method of forming the semiconductor structure. Embodiments of the present invention provide a semiconductor structure that includes two electrically connected ReRAM devices on two neighboring transistors. Embodiments of the present invention provide a semiconductor structure and a method of forming the semiconductor structure that promotes a controlled current conducting filament location in the ReRAM oxide. The method of forming the semiconductor structure provides two transistor devices integrated with two ReRAM devices that can be formed on a tight pitch. The ReRAM devices are each formed on a source/drain of a transistor of the pair of transistors.

Embodiments of the present invention provide faceted epitaxy source/drains that provide a higher electrical field at the tips of the faceted epitaxy source/drains. The higher electrical field at the tips of the faceted epitaxy source/drains provides a controlled location for filament formation in the oxide of the ReRAM device. In this way, embodiments of the present invention provide two tightly scaled transistor devices integrated with two unipolar ReRAM devices to represent one synaptic weight in order to accelerate the training of a deep neural network.

Embodiments of the present invention provide two ReRAM device that are electrically connected, and each ReRAM resides on a transistor. Each ReRAM device is formed on a source/drain that is on a portion of a fin on one side of the transistor gate. For purposes of the present invention, each of the two source/drains that are on one side of the transistor gate to be covered by a ReRAM device will be referred as a first source/drain. Each of the two source/drains that are on the other side of the transistor gate are will be referred to as a second source/drain in the present invention. The second source/drains connect by contacts to other semiconductor devices in a conventional manner.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention. The drawings are not necessarily to scale. The drawings are merely schematic representations, not intended to portray specific parameters of the invention. The drawings are intended to depict only typical embodiments of the invention. In the drawings, like numbering represents like elements.

FIGS. 1-18 illustrate an exemplary semiconductor structure that includes two electrically connected resistive random-access memory (ReRAM) devices integrated with two fin field effect transistors (FinFETs).

FIG. 1A is a top view illustrating semiconductor structure 100A according to an exemplary embodiment of the present invention. As depicted, FIG. 1A includes oxide 3, fins 4, where oxide 3 is a top surface of an insulator layer of a silicon on insulator (SOI) substrate. In various embodiments, oxide 3 is silicon oxide but, is not limited to this material. Oxide 3 and fins 4 may be formed with known semiconductor manufacture processes.

While two adjacent or neighboring fins 4 are depicted in FIG. 1A, any number of fins 4 may be present in semiconductor structure 100A. Fins 4 may be composed of a semiconductor material, for example, silicon, or a combination of semiconductor materials (e.g., SiGe) and may contain one or more undoped or doped portions (e.g., doped with n-type materials or p-type materials). Fins 4 may be formed using known semiconductor processes.

FIG. 1A depicts the location of cross section X1-X1 and cross section X2-X2 on fins 4 in semiconductor structure 100A. The location of X1-X1 and X2-X2 remains constant for each semiconductor structure in each figure of the present invention (e.g., in FIGS. 1B-25).

Figure 1B:
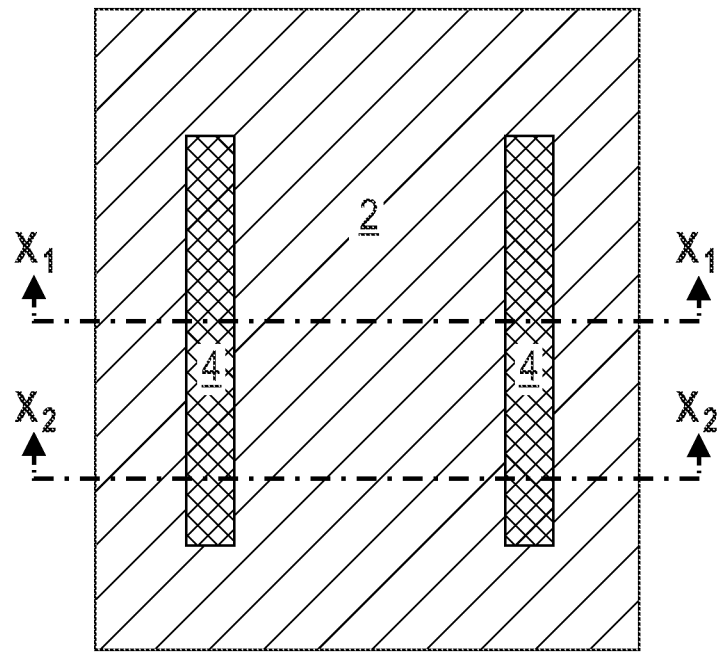
FIG. 1B is a top view illustrating a semiconductor structure according to an embodiment of the present invention.

FIG. 1B is a top view illustrating semiconductor structure 100B according to an exemplary embodiment of the present invention. As depicted, FIG. 1B includes two adjacent fins 4 on semiconductor substrate 2 (e.g., semiconductor structure 100B does not include oxide 3). While FIG. 1A and FIGS. 2-25 include oxide 3 as a buried oxide (BOX) of an SOI substrate below fins 4, in various embodiments, the semiconductor structures depicted in FIGS. 2-25 are formed on semiconductor structure 100B instead of semiconductor structure 100A. In these embodiments, the semiconductor structures of FIGS. 2-25 can be formed on a bulk semiconductor substrate 2 when oxide 3 is not be present.

Semiconductor substrate 2 may be composed of a semiconductor material, for example, silicon or a combination of semiconductor materials (e.g., SiGe) and may contain one or more doped portions (e.g., doped with n-type materials or p-type materials). In various embodiments, semiconductor substrate 2 includes one or more semiconductor materials. Non-limiting examples of suitable semiconductor substrate 2 materials may include Si (silicon), strained Si, Ge (germanium), SiGe (silicon germanium), Si alloys, Ge alloys, III-V material, such as GaAs (gallium arsenide), InAs (indium arsenide), InP (indium phosphide), or indium gallium arsenide (InGaAs), II-VI materials such as CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride), or any combination thereof. In an embodiment, semiconductor substrate 2 may include silicon. In one embodiment, semiconductor substrate 2 is a bulk semiconductor substrate. The term "bulk semiconductor substrate" denotes a substrate that is composed entirely of one or more semiconductor materials. Semiconductor substrate 2 may be a single crystalline semiconductor material. Semiconductor substrate 2 can have any of the well-known crystal orientations. For example, the crystal orientation of semiconductor substrate 2 may be {100}, {110}, or {111}. Other crystallographic orientations besides those specifically mentioned can also be used in the present application. In various embodiments, semiconductor substrate 2 is a wafer or a portion of a wafer. In some embodiments, semiconductor substrate 2 includes one or more of doped regions, undoped regions, strained regions, or defect rich regions.

Figure 2:
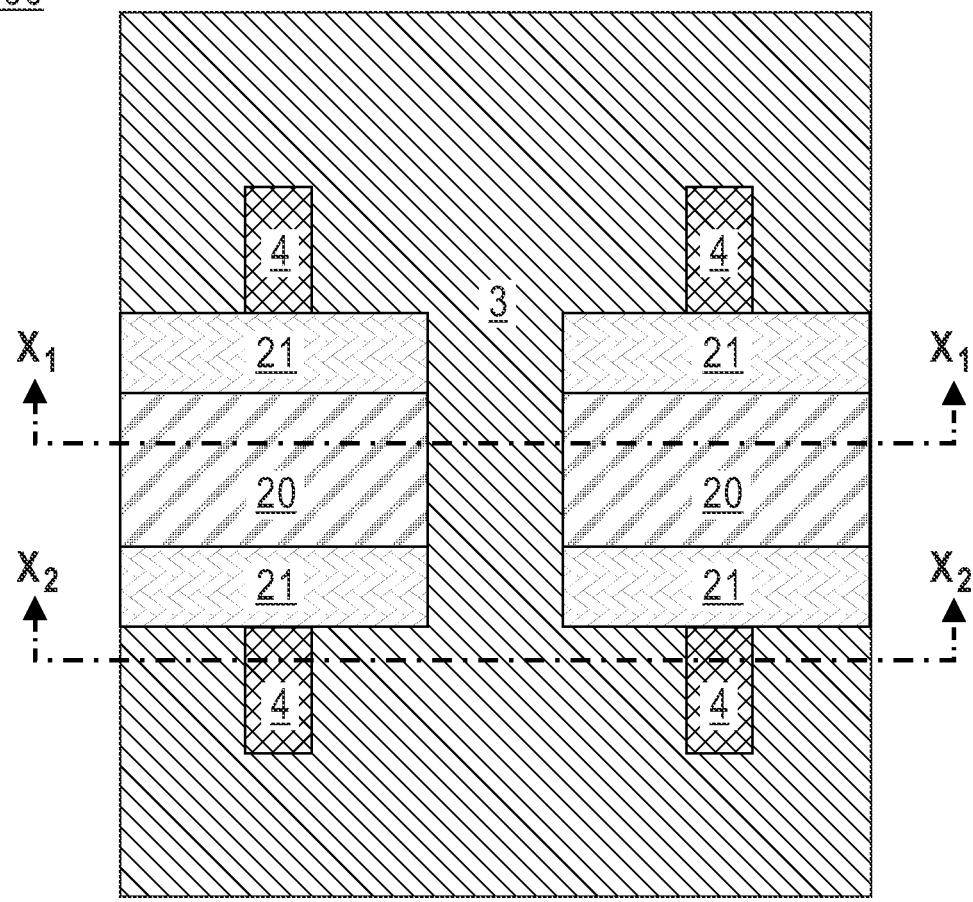
FIG. 2 is a top view illustrating the semiconductor structure with fins and dummy gates with spacers according to an exemplary embodiment of the present invention.

FIG. 2 is a top view illustrating semiconductor structure 200 with fins 4 and dummy gate 20 with spacers 21 according to an exemplary embodiment of the present invention. As depicted, FIG. 2 includes oxide 3, fins 4, dummy gate 20 and spacer 21. In various embodiments, dummy gate 20 is a sacrificial gate or a dummy gate. A dummy gate formed from polysilicon, for example, may be removed and replaced in later process steps with a replacement gate that is formed with a metal electrode that is usually over a gate dielectric material (not depicted). Dummy gate 20 may can be made of polysilicon, amorphous silicon, or multilayered combinations thereof that can be deposited, for example, by chemical vapor deposition (CVD) or plasma enhanced chemical vapor deposition (PECVD), onto a top surface of oxide 3 and surrounding a portion of fins 4. Dummy gate 20 can be over a middle portion of fins 4 and over a portion of oxide 3. Spacer 21 is any spacer material suitable for use with a transistor device. For example, spacer 21 is composed of a dielectric material, such as, silicon nitride or another known spacer material. Spacer 21 may be deposited on the sides of dummy gate 20 using known spacer formation processes.

Figure 3:
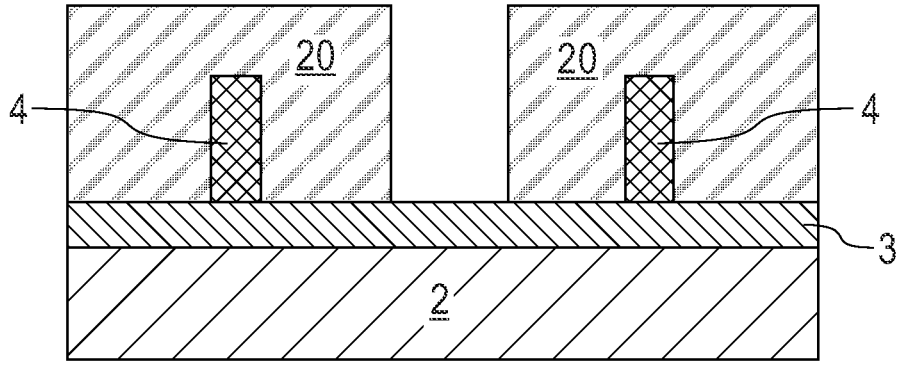
FIG. 3 is a cross section X1-X1 illustrating the semiconductor structure after depositing dummy gates over the fins on a semiconductor substrate according to an exemplary embodiment of the present invention.

FIG. 3 is a cross section view X1-X1 illustrating semiconductor structure 300 after depositing dummy gate 20 over fins 4 on oxide 3 according to an exemplary embodiment of the present invention. As depicted in FIGS. 1A and 1B, cross section X1-X1 bisects a middle portion of fins 4. The cross section X1-X1 in FIG. 3 depicts dummy gate 20 over fins 4 and on a portion of oxide 3, oxide 3 under fins 4 and above semiconductor substrate 2. As previously discussed, while FIG. 3 depicts oxide 3 in an SOI semiconductor substrate that consists of semiconductor substrate 2 and oxide 3, other embodiments of the present invention use semiconductor structure 100B that does not include oxide 3, in which case, fins 4 and dummy gate 20 reside on semiconductor substrate 2.

Figure 4:
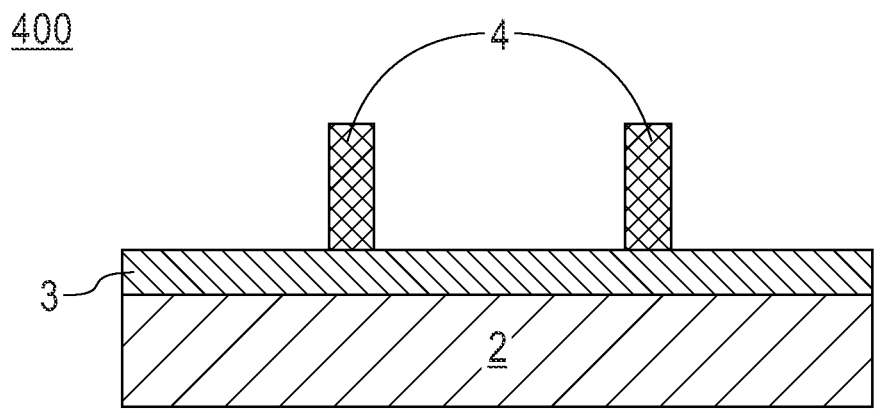
FIG. 4 is a cross section X2-X2 illustrating the semiconductor structure after depositing dummy gates over the fins on a semiconductor substrate according to an exemplary embodiment of the present invention.

FIG. 4 is a cross section view X2-X2 illustrating semiconductor structure 400 with the fins 4 according to an exemplary embodiment of the present invention. As depicted in FIGS. 1A and 1B, cross section X2-X2 bisects one end portion of fins 4 in a bottom portion of semiconductor structure 400. As depicted, the cross section X2-X2 in FIG. 4 includes semiconductor substrate 2 under oxide 3 and fins 4 on a portion of oxide 3. As previously discussed, while FIG. 4 depicts oxide 3 (e.g., a BOX in an SOI semiconductor substrate that consists of semiconductor substrate 2 and oxide 3), other embodiments of the present invention do not include oxide 3. In these embodiments (i.e., without oxide 3), fins 4 are formed directly on a portion of semiconductor substrate 2.

Figure 5:
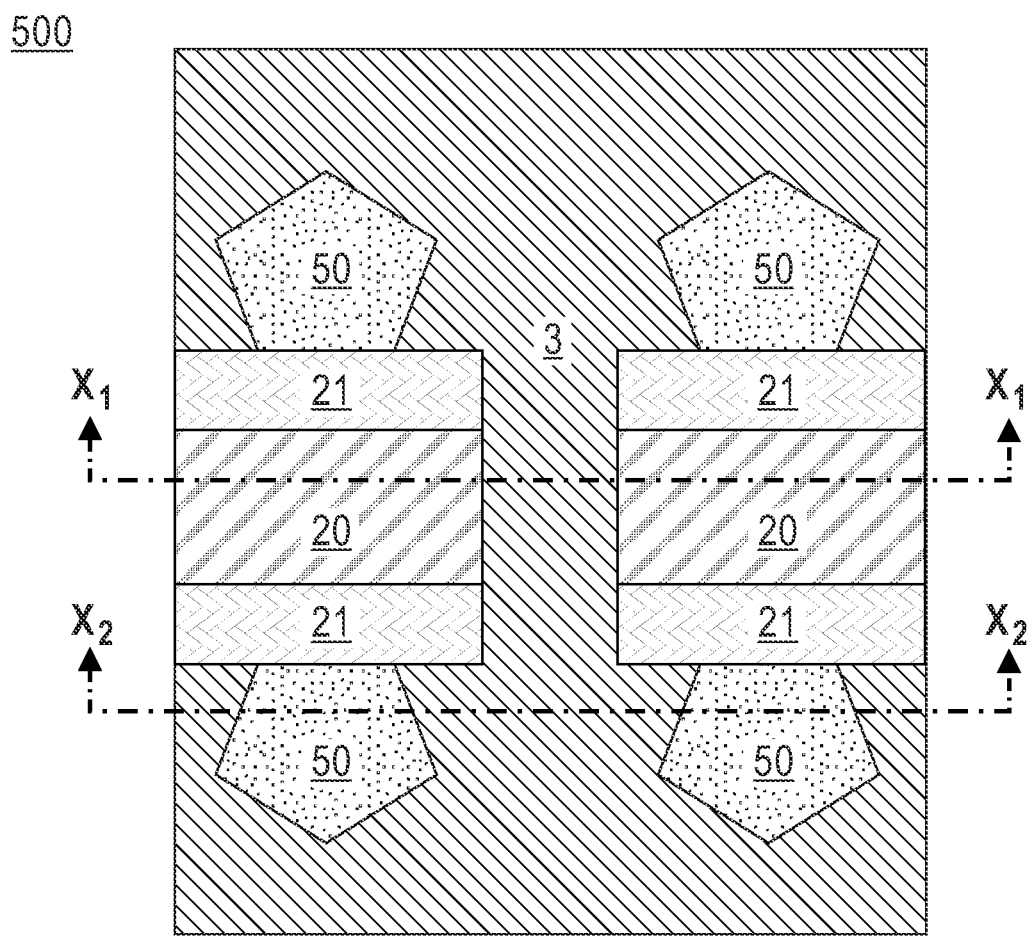
FIG. 5 is the top view of the semiconductor structure after source/drain formation according to an exemplary embodiment of the present invention.

FIG. 5 is the top view of semiconductor structure 500 after source/drain (S/D) 50 formation according to an exemplary embodiment of the present invention. As depicted, FIG. 5 includes S/D 50, spacer 21, dummy gate 20 oxide 3, the location of cross section X1-X1 and the location of cross section X2-X2 on semiconductor structure 500. Semiconductor structure 500 includes four source/drains (S/D 50) where, as previously discussed, the first S/D 50 are the pair of source/drains depicted below dummy gate 20 on X2-X2 in FIG. 5 and second S/D 50 are the pair of source/drains depicted above dummy gate 20 in FIG. 5. In this way, each of fins 4 depicted in FIG. 2 can have one first S/D 50 on one end of each fin of the pair of adjacent fins 4 on X2-X2 in a bottom portion of semiconductor structure 500 and second S/D 50 on the other end of each fin of the pair of adjacent fins 4 above spacer 21 that is abutting and above dummy gate 20 (e.g., each fin has one first S/D 50 and one second S/D 50). In other words, each of the pair of first S/D 50, depicted in FIG. 5, is abutting spacer 21 below dummy gate 20 on X2-X2. Similarly, each of the pair of second S/D 50 is abutting spacer 21 above dummy gate 20 in FIG. 5.

Using epitaxial growth processes, such as, for example molecular beam epitaxy (MBE), on each of the four S/D 50 may be formed with a faceted epitaxy. For example, each of the pair of first S/D 50 below dummy gate 20 may be formed with a faceted epitaxy that extends away from spacer 21 on dummy gate 20 (e.g., extends below spacer 21 on dummy gate 20) and the pair of second S/D 50 above dummy gate 20 may be formed with a faceted epitaxy extending away from or outward from spacer 21 on dummy gate 20. Other methods such as rapid thermal chemical vapor deposition (RTCVD), low pressure chemical vapor deposition (LPCVD), low-energy plasma deposition (LEPD), ultra-high vacuum chemical vapor deposition (UHVCVD), atmospheric pressure chemical vapor deposition (APCVD) may also be used to epitaxially grow each of S/D 50.

Figure 7:
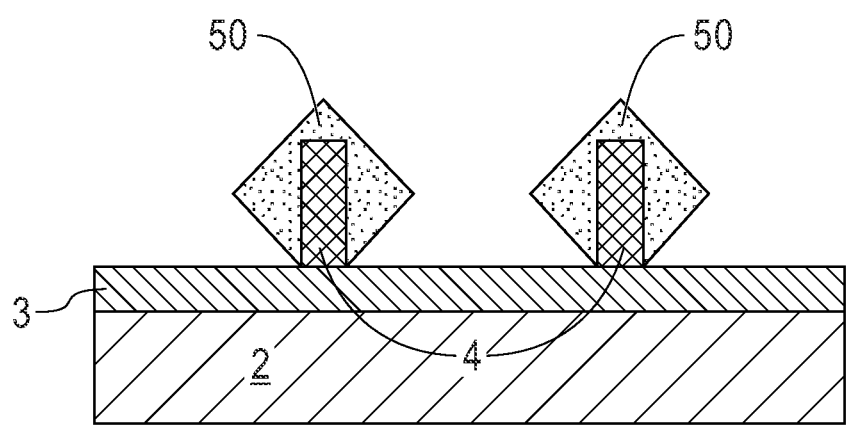
FIG. 7 is the cross section X2-X2 illustrating the semiconductor structure after the source/drain formation according to an exemplary embodiment of the present invention.

In various embodiments, each of the source/drains (e.g., the two first S/D 50 below dummy gate 20 on X2-X2 and the two second S/D 50 above dummy gate 20) is faceted. The faceted epitaxy forming each of the source/drains can be grown on exposed surfaces of the end portions of fins 4 (depicted in FIG. 2). As previously discussed, the faceted epitaxy can grow in a diamond faceted shape (<111>-lattice plane bound epitaxy) forming a pointed cone, as depicted in FIG. 7. As a result, the faceted epitaxy S/D 50 may include, for example, four facets or more facets. The pointed shape of the faceted epitaxy of each S/D 50 enhances the electric field at the tips of the pointed shape. In this way, the pointed shape of the faceted epitaxy can enhance the electric field at each tip of the diamond shaped in each of S/D 50. The pointed shape of the pair of first S/D 50 on which the ReRAM devices will be formed later will promote the current conducting filament formation in a specific location (i.e., on the pointed tips of the first S/D 50) in the respective ReRAM device when each respective ReRAM device is complete.

In various embodiments, doping of each of S/D 50 occurs during epitaxial source/drain growth. For example, each of S/D 50 can be doped with a dopant, which may be an n-type dopant or a p-type dopant. Each of the four source/drains (i.e., each of S/D 50) formed with faceted epitaxy can be a same type of doping (e.g., all n-type dopant) and a same dopant level or amount of dopant included in each source/drain. As known to those skilled in the art, the term "n-type" denotes the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" denotes the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. For example, all of the four source/drains (i.e., the pair of first S/D 50 and the pair of second S/D 50) may be heavily doped with one of phosphorus or boron, where the doping level may range from of $4\times10^{20}$ cm$^{-3}$ to $1.5\times10^{21}$ cm$^{-3}$. In various embodiments, each of first S/D 50 below dummy gate 20 and second S/D 50 above dummy gate 20 in semiconductor structure 500 have a same level of doping with a same type of dopant. For example, when each of first S/D 50 and second S/D 50 in semiconductor structure 500 is doped with a n-type dopant, such as, phosphorus or arsenic, then, upon completion of the transistor (depicted later in FIG. 15), the transistor can be a n-type field effect transistor (nFET).

Figure 6:
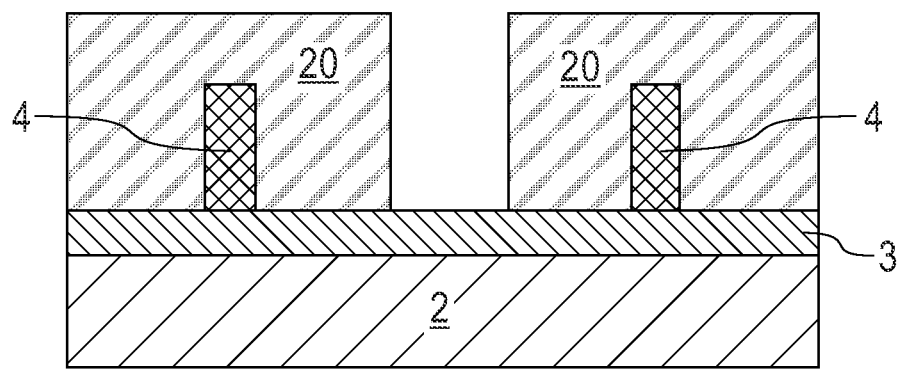
FIG. 6 is the cross section X1-X1 illustrating the semiconductor structure after the source/drain formation according to an exemplary embodiment of the present invention.

FIG. 6 is the cross section X1-X1 illustrating semiconductor structure 600 after source/drain 50 formation according to an exemplary embodiment of the present invention. As depicted, FIG. 6 includes dummy gate 20 over fins 4 and on a portion of oxide 3, fins 4 on a portion of oxide 3 and oxide 3 above semiconductor substrate 2. As previously discussed, in embodiments when oxide 3 is not present, as depicted in FIG. 1B, then, fins 4 and dummy gate 20 reside on semiconductor substrate 2.

FIG. 7 is the cross section X2-X2 illustrating semiconductor structure 700 after forming first S/D 50 using faceted epitaxy according to an exemplary embodiment of the present invention. As depicted, FIG. 7 includes first S/D 50 over a portion of fins 4. For example, first S/D 50 can be formed on an end of each of fins 4 that is below dummy gate 20 in FIG. 5. As previously discussed in detail with respect to FIG. 5, the faceted epitaxy can grow in a diamond faceted shape (<111>-lattice plane bound epitaxy) to form first S/D 50. Each oft S/D 50, including first S/D 50 in FIG. 7, may be grown to a particular thickness, such as, for example between 10 nm to 30 nm on fins 4 although, other thicknesses are possible.

Figure 8:
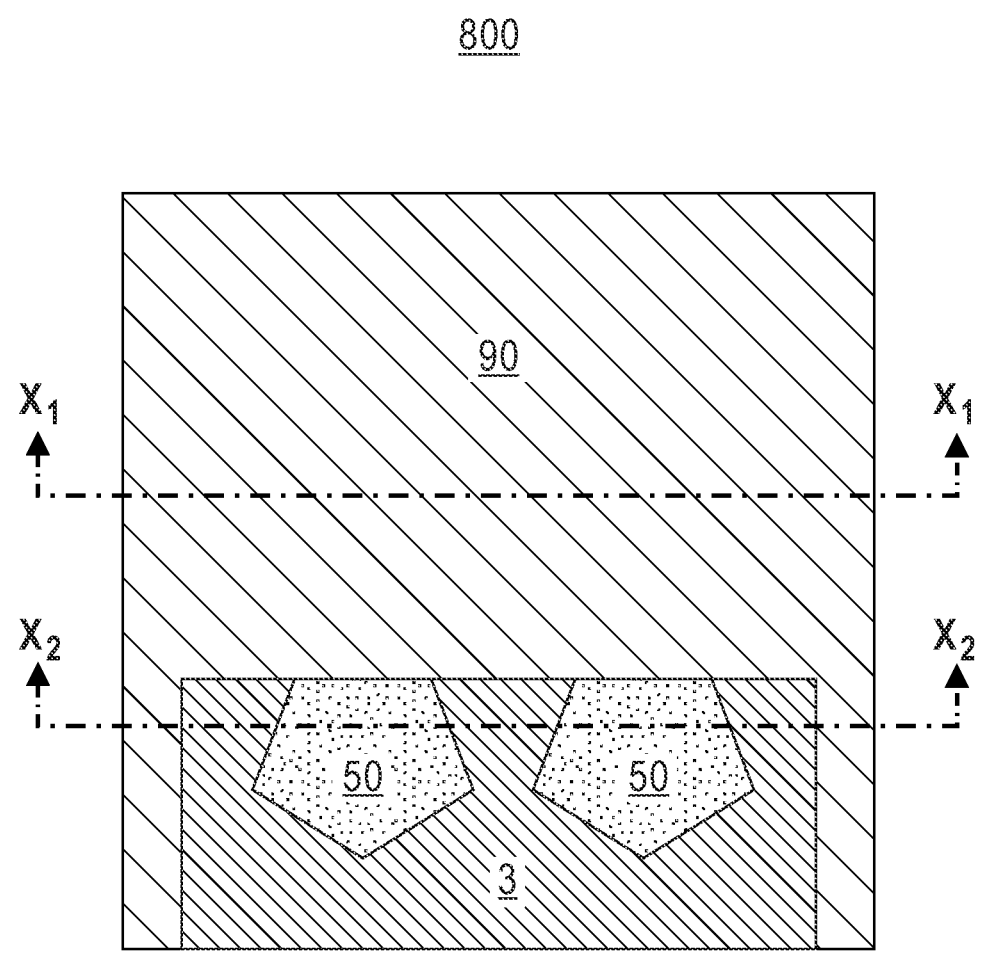
FIG. 8 is the top view illustrating the semiconductor structure after interlayer dielectric (ILD) deposition, dummy gate replacement, and ILD etch according to an exemplary embodiment of the present invention.

FIG. 8 is the top view illustrating semiconductor structure 800 after ILD 90 deposition, after dummy gate 20 replacement with gate stack 60, and after a selective ILD 90 etch according to an exemplary embodiment of the present invention. As depicted, FIG. 8 includes ILD 90, first S/D 50, oxide 3, a location of X1-X1, and a location of X2-X2. FIG. 8 depicts first S/D 50 exposed after a selective etch of a portion of ILD 90 that is deposited over semiconductor structure 800 after replacing dummy gate 20. The selective etch of ILD 90 over semiconductor structure 800 exposes first S/D 50 in a bottom portion of FIG. 8 (e.g., first S/D 50 on X2-X2).

The portion of ILD 90 can be removed from a portion of semiconductor structure 800 using known etch processes, such as photolithography and reactive ion etch (RIE). While FIG. 8 depicts the portion of ILD 90 removed from the pair of first S/D 50 depicted on X2-X2 in the bottom portion of semiconductor structure 800, in other examples, ILD 90 may be selectively removed from the pair of second S/D 50 above dummy gate 20 in FIG. 5 instead of removing ILD 90 from the pair of first S/D 50. In these examples, when selectively removing ILD 90 from the top portion of semiconductor structure 800 to expose the pair of second S/D 50 then, the ReRAM devices can be formed on second S/D 50 in later processes (e.g., instead of on first S/D 50).

Figure 9:
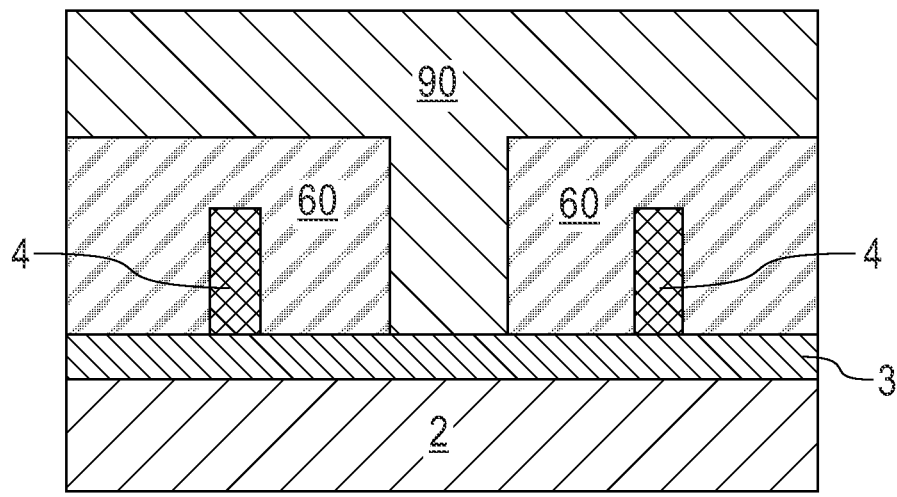
FIG. 9 is the cross section X1-X1 illustrating the semiconductor structure after the ILD deposition, the dummy gate replacement, and the ILD etch according to an exemplary embodiment of the present invention.

FIG. 9 is the cross section X1-X1 illustrating semiconductor structure 900 after ILD 90 deposition, after dummy gate 20 replacement, and after ILD 90 etch according to an exemplary embodiment of the present invention. As previously discussed, cross section X1-X1 bisects a center portion of fins 4. As depicted, FIG. 9 includes ILD 90 deposited over gate stack 60 and a portion of oxide 3, fins 4 under gate stack 60 and on oxide 3. Oxide 3 resides over semiconductor substrate 2.

A layer of ILD 90 can be composed of silicon dioxide, silicon nitride, other ILD dielectric material. ILD 90 can be deposited over semiconductor structure 800 using a suitable deposition process, such as CVD, ALD, etc. Using known dummy gate replacement processes, a CMP can be performed to planarize semiconductor structure 800 after ILD 90 deposition exposing the top surface of dummy gate 20 before selectively removing dummy gate 20 and replacing dummy gate 20 with gate stack 60. Gate stack 60 may include a gate electrode (not depicted) over a gate dielectric material with spacers formed on the sides of the gate electrode. For example, the gate electrode in gate stack 60 may be composed of a conductive material such as, doped polycrystalline or amorphous silicon, germanium, silicon germanium, a metal (e.g., tungsten (W), titanium (Ti), tantalum (Ta), ruthenium (Ru), hafnium (Hf), zirconium (Zr), or other suitable gate electrode material. The gate dielectric material (not depicted) may be a dielectric material or a high k dielectric material such as oxides, nitrides, oxynitrides, silicates (e.g., metal silicates), aluminates, titanates, nitrides, hafnium oxide, hafnium silicon oxide, hafnium silicon oxynitride, tantalum carbide (TaC), titanium carbide (TiC), titanium aluminum carbide (TiAlC), but, are not limited to these materials. Gate stack 60 may be deposited by one or more of CVD, PECVD, atomic layer deposition (ALD), chemical deposition processes but, are not limited to these processes. Gate stack 60 can be deposited on portion of oxide 3 replacing dummy gate 20.

Another layer of ILD 90 can be deposited over semiconductor structure 800 after replacing dummy gate 20 with gate stack 60. The layer of ILD 90 covers exposed surfaces of gate stack 60 and oxide 3 in FIG. 9 and over first S/D 50 and second S/D 50 not depicted in FIG. 9. A portion of ILD 90 is selectively removed (depicted in FIG. 10).

Figure 10:
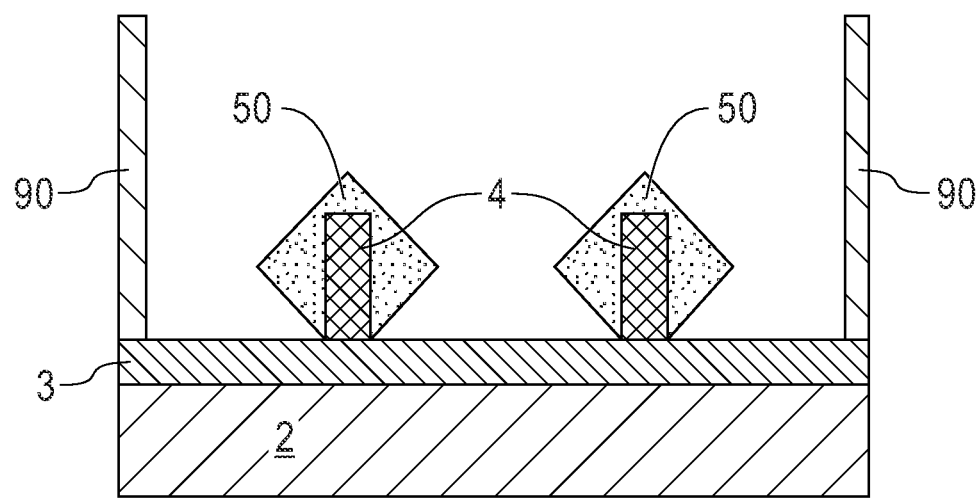
FIG. 10 is the cross section X2-X2 illustrating the semiconductor structure after ILD deposition dummy gate replacement, and ILD etch according to an exemplary embodiment of the present invention.

FIG. 10 is the cross section X2-X2 illustrating semiconductor structure 1000 after ILD 90 deposition and ILD 90 etch according to an exemplary embodiment of the present invention. As depicted, FIG. 10 includes ILD 90 on portions of oxide 3, first S/D 50 on fins 4, fins 4 on a portion of oxide 3, and semiconductor substrate 2 under oxide 3. In some embodiments, oxide 3 is not present and fins 4 and the portions of ILD 90 reside on semiconductor substrate 2.

A portion of ILD 90 can be selectively removed from first S/D 50. As previously discussed, each of first S/D 50 resides in cross section X2-X2. Each of first S/D 50 can be over the ends of the two adjacent fins 4 (depicted in FIG. 5). ILD 90 can be selectively removed using known photolithography methods and etch processes suitable for the selective removal of an ILD material. The selective etch of ILD 90 can stop at the top surface of oxide 3.

Figure 11:
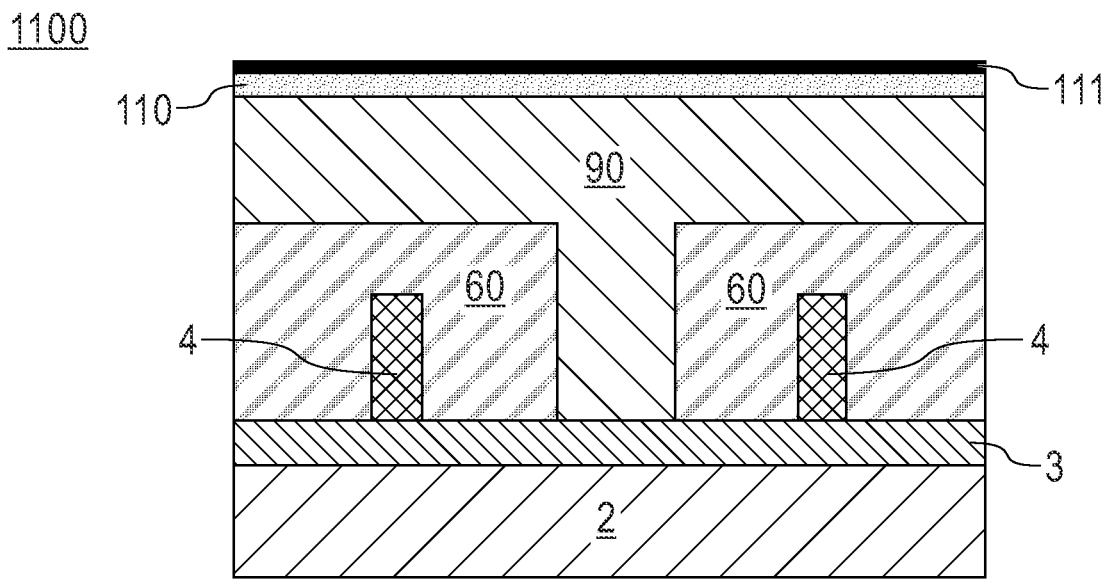
FIG. 11 is the cross section X1-X1 illustrating the semiconductor structure after depositing a switching layer and a top electrode material according to an exemplary embodiment of the present invention.

FIG. 11 is the cross section X1-X1 illustrating semiconductor structure 1100 after depositing a switching layer 110 and depositing top electrode 111 according to an exemplary embodiment of the present invention. As depicted, FIG. 11 includes the elements of FIG. 9 and top electrode 111 on switching layer 110 with ILD 90 under switching layer 110. Using a deposition process, such as, ALD, a layer of a metal oxide for switching layer 110 can be conformally deposited over ILD 90. Another deposition process, such as ALD or CVD, can deposit a layer of top electrode 111 over switching layer 110. In various embodiments, switching layer 110 is a high k, metal oxide. For example, switching layer 110 may be composed of a compound material or alloy, such as, a combination of hafnium and oxygen ($HfO_x$), tantalum and oxygen (e.g., $TaO_x$), titanium and oxygen (e.g., $TiO_x$) or the like. A thickness of switching layer 110 can range from 3 nm to 10 nm but, is not limited to these thicknesses. As depicted in FIG. 11, switching layer 110 is deposited over ILD 90.

A layer of an electrode material can be deposited over switching layer 110 to form top electrode 111 using known deposition methods, such as, ALD or CVD. Top electrode 111 may be composed of a titanium nickel (TiN) alloy, a titanium nickel aluminum alloy (TiN/Al), or a titanium aluminum containing alloy, such as, a titanium aluminum carbon (TiAlC) alloy but, is not limited to these materials. Top electrode 111 may have a thickness ranging from 3 nm to 10 nm but is not limited to this thickness.

Figure 12:
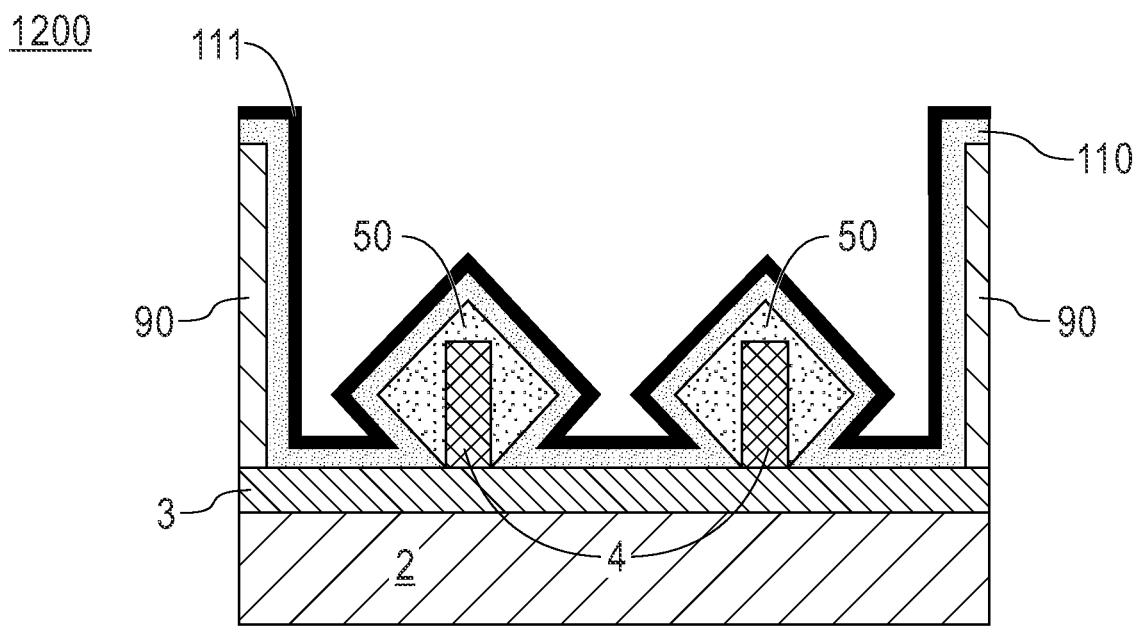
FIG. 12 is the cross section X2-X2 illustrating the semiconductor structure after depositing the switching layer and the top electrode according to an exemplary embodiment of the present invention.

FIG. 12 is the cross section X2-X2 illustrating semiconductor structure 1200 after depositing top electrode 111 over switching layer 110 according to an exemplary embodiment of the present invention. As depicted, FIG. 12 includes the elements of FIG. 10 and top electrode 111 over switching layer 110, where switching layer 110 is over portions of oxide 3, is over portions of the remaining portions of ILD 90 and is over first S/D 50. In one embodiment, a silicide is formed on first S/D 50 prior to switching layer 110 deposition. In cross section X2-X2, switching layer 110 is deposited over the remaining portions of ILD 90, over exposed portions of oxide 3, and on first S/D 50 using the processes as previously discussed with respect to FIG. 11. Top electrode 111 can be deposited over switching layer 110 as previously discussed with respect to FIG. 11.

Figure 13:
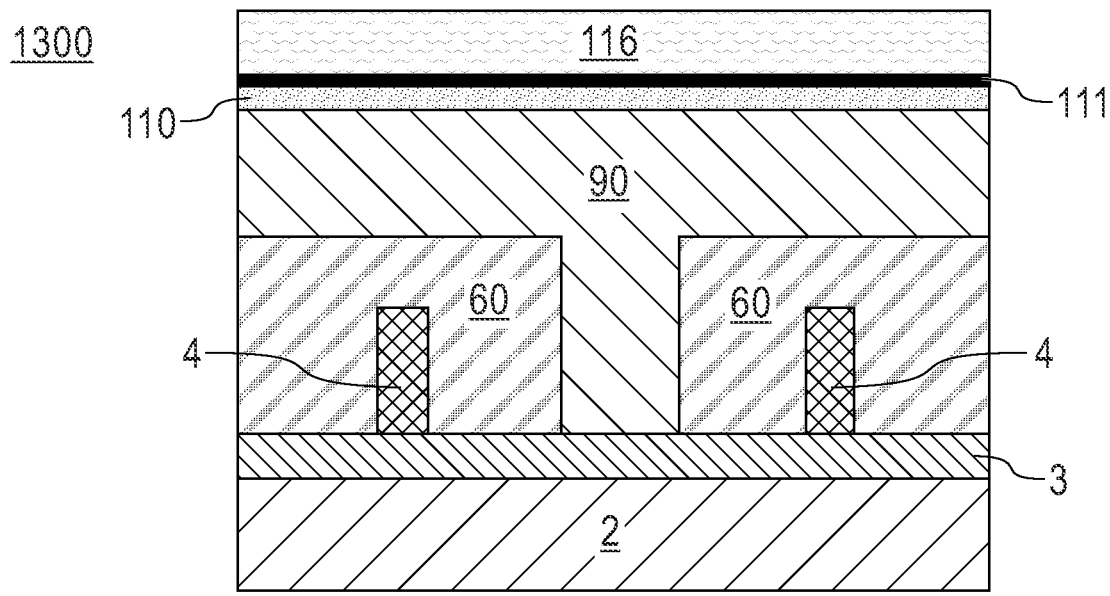
FIG. 13 is the cross section X1-X1 illustrating the semiconductor structure after depositing a metal layer and a chemical-mechanical polish (CMP) according to an exemplary embodiment of the present invention.

FIG. 13 is the cross section X1-X1 illustrating semiconductor structure 1300 after depositing metal layer 116 according to an exemplary embodiment of the present invention. As depicted, FIG. 13 includes the elements of FIG. 11 and metal layer 116 over top electrode 111. Using known deposition processes, such as, ALD, a layer of a low resistivity metal, such as, tungsten (W), titanium nitride (TiN), aluminum doped titanium nitride, or copper (Cu), is conformally deposited over top electrode 111 in semiconductor structure 1300.

Figure 14:
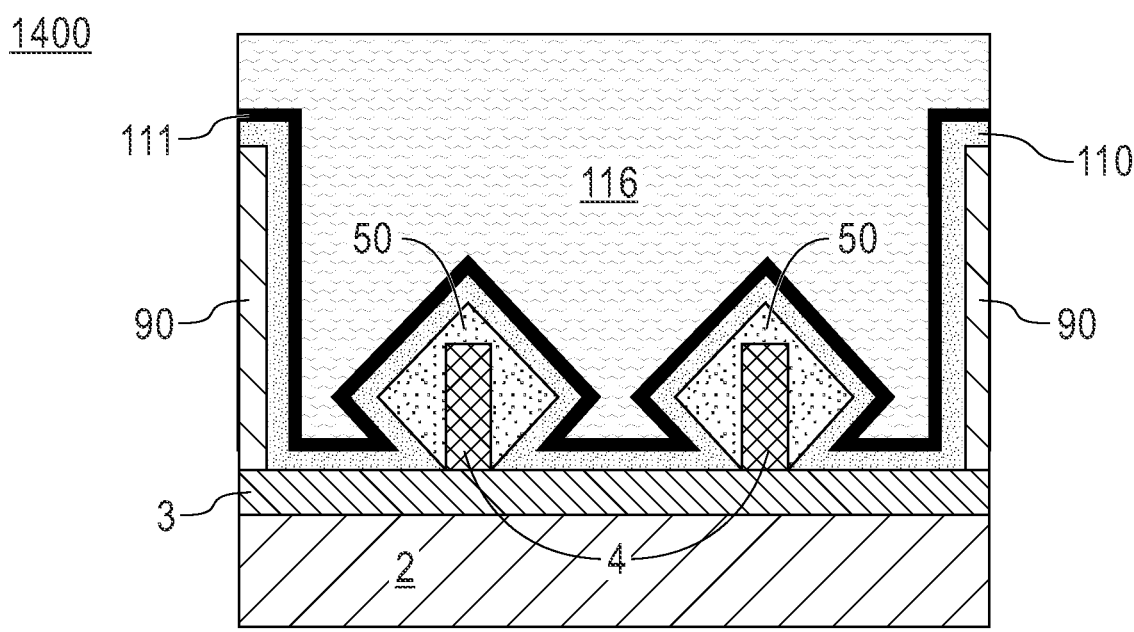
FIG. 14 is a cross section X2-X2 illustrating the semiconductor structure after depositing the metal layer and the chemical-mechanical polish (CMP) according to an exemplary embodiment of the present invention.

FIG. 14 is a cross section X2-X2 illustrating semiconductor structure 1400 after depositing metal layer 116 according to an exemplary embodiment of the present invention. As depicted, FIG. 14 includes the elements of FIG. 12 (e.g., switching layer 110, ILD 90, dummy gate 20, fins 4, oxide 3, and semiconductor substrate 2) and metal layer 116 over top electrode 111. Metal layer 116 can be conformally deposited over top electrode 111 and fills the opening or trench where ILD 90 was removed (e.g., depicted in FIG. 12). Metal layer 116 covers top electrode 111 and fills the trench where ILD 90 was removed. Metal layer 116 can be deposited to a level that is higher than the top surface of top electrode 111 on the remaining portions of ILD 90.

Figure 15:
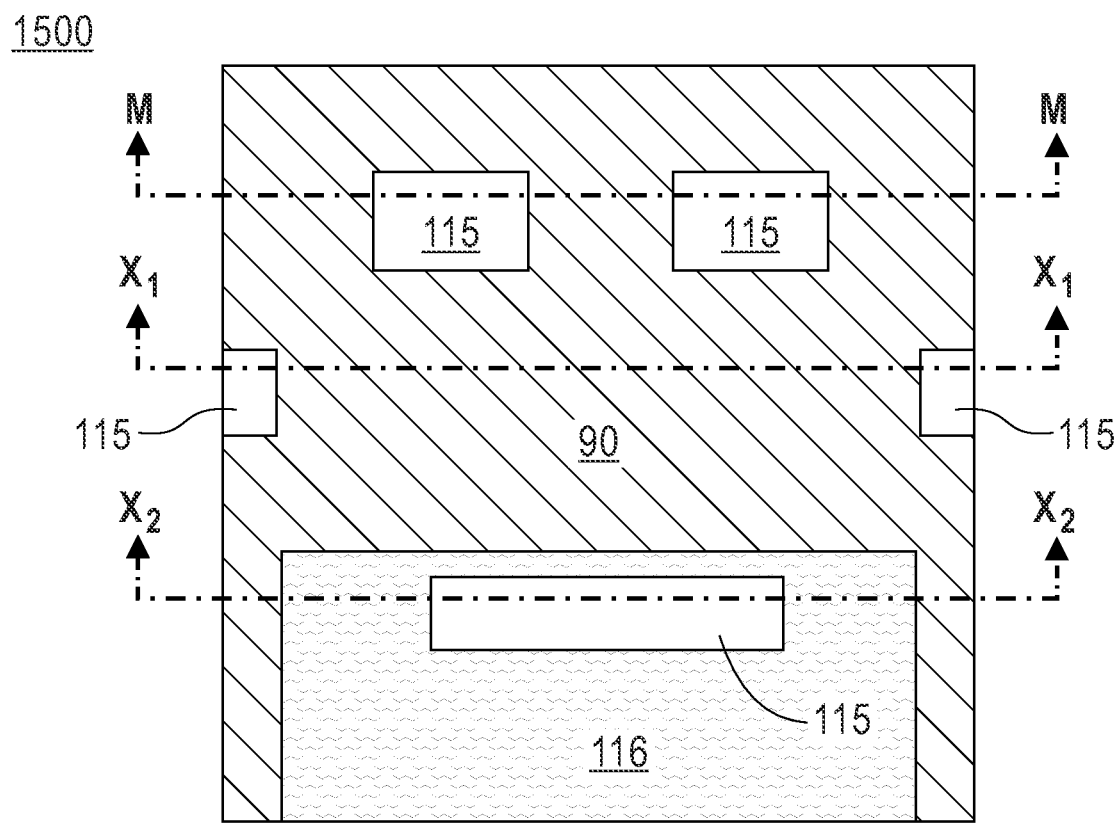
FIG. 15 is the top view illustrating the semiconductor structure after a CMP and forming contacts according to an exemplary embodiment of the present invention.

FIG. 15 is the top view illustrating semiconductor structure 1500 after forming contacts 115 according to an exemplary embodiment of the present invention. As depicted, FIG. 15 includes five contacts 115, ILD 90 surrounding four of contacts 115, ILD 90 surrounding metal layer 116, and one of contacts 115 in metal layer 116.

FIG. 15 depicts the top surface of semiconductor structure 1500 after a CMP that removes the top portion of ILD 90, removes the top portions of top electrode 111 and removes a top portion of switching layer 110 over ILD 90, and before forming contact 115.

Contacts 115 can be formed with known contact formation processes. For example, contacts 115 may be formed by a deposition of another layer of ILD 90 and selective etch of the deposited ILD 90. A deposition of a conductive material over semiconductor structure 1500 for can occur for contacts 115 formation. For example, the deposition of the conductive material for contacts 115 can occur using one of CVD, plasma enhanced CVD, physical vapor deposition (PVD), plating, e-beam evaporation, or by ALD. The conductive material filling for contacts 155 may be a conductive metal, for example, aluminum (Al), platinum (Pt), gold (Au), tungsten (W), titanium (Ti), or any combination thereof.

A planarization process, such as a CMP, is performed to remove any conductive material from the top surface of ILD 90. The CMP can remove portions of the contact metal layer over ILD 90 in order to form contacts 115 in the remaining ILD 90 and in the remaining metal layer 116. After contacts 115 are formed, additional layers of ILD 90 may be deposited and standard back end of the line (BEOL) processes can form the vias and lines of the semiconductor chip interlevel metal layers and external semiconductor chip contact pads (not depicted).

FIG. 15 also illustrates the location of cross section X1-X1 depicted later in FIG. 16. Cross section X1-X1 is over a center portion of semiconductor structure 1500 through two of contacts 115. FIG. 15 illustrates the location of cross section X2-X2. Cross section X2-X2 is in a bottom portion of semiconductor structure 1500 that is depicted later in FIG. 17. Additionally, FIG. 15 illustrates the location of a cross section M-M through two of contacts 115 in a top portion of semiconductor structure 1500 that is depicted later in FIG. 18.

The top two contacts 115 located along M-M can provide an electrical connection to the pair of second S/D 50 (depicted in FIG. 5) on each of fins 4 in two FinFET transistors as depicted later in FIG. 16. The two contacts 115 located in X1-X1 can provide an electrical connection to each of gate stack 60 (depicted in FIG. 17). Contacts 115 depicted on X2-X2 that is surrounded by metal layer 116 can provide an electrical connection to the two ReRAM devices (depicted in FIG. 18) that are on the two FinFET transistors (e.g., contact 115 is in direct contact with metal layer 116 connecting the two ReRAMS formed by top electrode 111 and switching layer 110 on first S/D 50). In some embodiments, the semiconductor structures 1500, 1600, 1700, and 1800 can be created without oxide 3.

Figure 16:
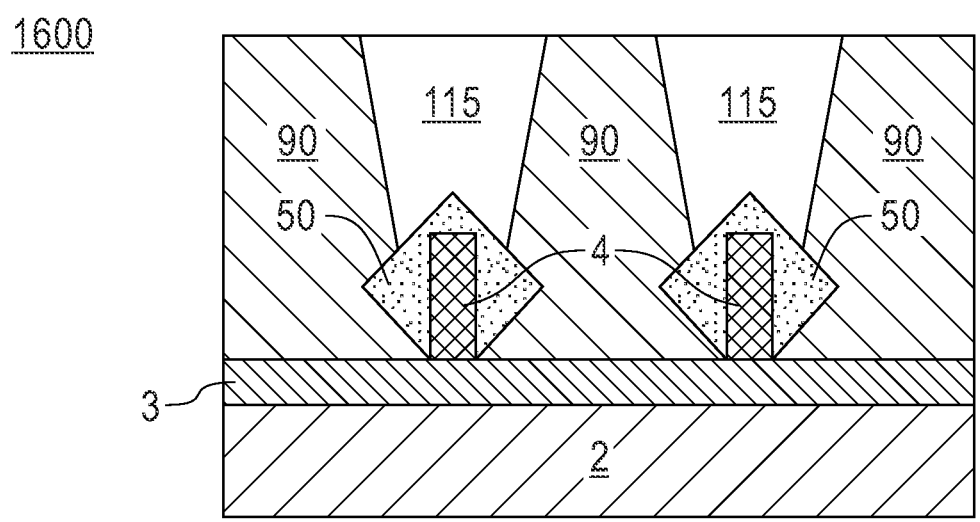
FIG. 16 is the cross section M-M illustrating the semiconductor structure after the CMP and forming the contacts according to an exemplary embodiment of the present invention.

FIG. 16 is the cross section M-M illustrating semiconductor structure 1600 after a CMP and after forming contacts 115 according to an exemplary embodiment of the present invention. As depicted, FIG. 16 includes contacts 115 over each second S/D 50 that are over fins 4.

Using known contact formation processes, as discussed above in reference to FIG. 15 (e.g., one or more CMP processes, ILD 90 deposition, selective ILD 90 etch, contact metal layer deposition, and another CMP to remove the metal of contact 115 over ILD 90), each contact 115 of a pair of contacts 115 forms over one of second S/D 50. Contacts 115 provide an electrical connection to second S/D 50 on an end portion of each of fins 4 (e.g., second S/D 50 are on an end portion of fins 4 that is above dummy gate 20 in FIG. 5). Each of contacts 115 depicted in FIG. 16 provide an electrical connection to one of fins 4 in the two adjacent transistors (e.g., FinFETs). Contacts 115 in FIG. 16 provide an electrical connection through second S/D 50 to each of the FinFETs formed on oxide 3. In some embodiments, when oxide 3 is not present, contacts 115 provide a connection to two FinFETs formed on semiconductor substrate 2.

Figure 17:
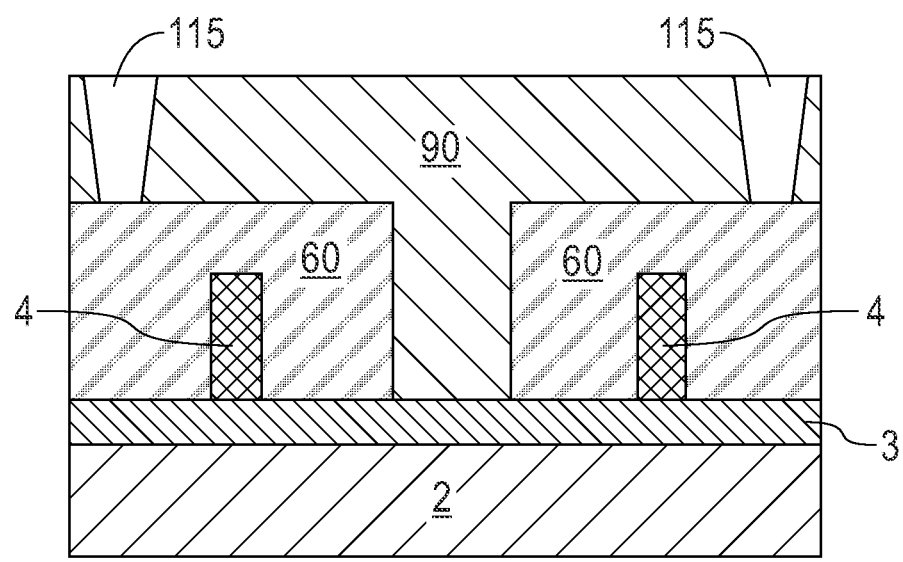
FIG. 17 is the cross section X1-X1 illustrating the semiconductor structure after the CMP and forming the contacts according to an exemplary embodiment of the present invention.

FIG. 17 is the cross section X1-X1 illustrating semiconductor structure 1700 after a CMP and after forming contacts 115 according to an exemplary embodiment of the present invention. As depicted, FIG. 17 includes a pair of contacts 115 with each contact over one of gate stack 60. Each of fins 4 is depicted under one of gate stack 60 while oxide 3 can be under each of fins 4 and under gate stack 60. Semiconductor substrate 2 resides under oxide 3.

The CMP removes a top portion of metal layer 116, a portion of top electrode 111, a top portion of switching layer 110 and a top portion of ILD 90. Using known contact formation processes, as previously discussed regarding FIG. 15, (e.g., CMP, ILD deposition, selective ILD etch, contact metal deposition, and another CMP), contacts 115 can be formed over each of the pair of gate stack 60. Contacts 115 depicted in FIG. 17 provide an electrical connection to gate stack 60 in each of the FinFETs formed over fins 4.

Figure 18:
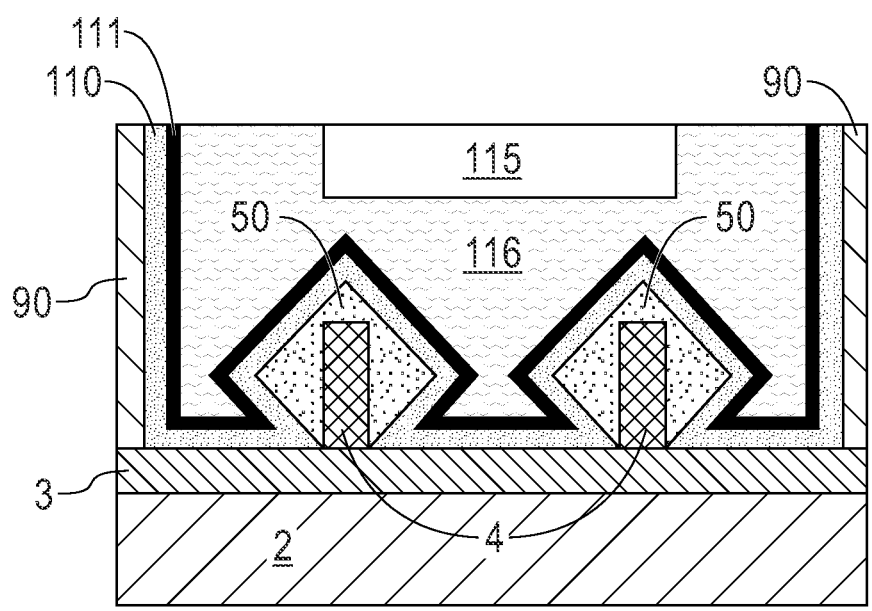
FIG. 18 is the cross section X2-X2 illustrating the semiconductor structure after the CMP and forming the contacts according to an exemplary embodiment of the present invention.

FIG. 18 is the cross section X2-X2 illustrating semiconductor structure 1800 after a CMP and forming contacts 115 according to an exemplary embodiment of the present invention. As depicted, FIG. 18 includes metal layer 116 under and surrounding one of contacts 115, top electrode 111 surrounded by metal layer 116 (e.g., top electrode 111 under and abutting the vertical sides of metal layer 116), switching layer 110 under top electrode 111, ILD 90 outside of the vertical sides of switching layer 110. Oxide 3 can be under a bottom portion of switching layer 110, under fins 4, and under portions of ILD 90. Semiconductor substrate 2 can be under oxide 3. In some embodiments, oxide 3 is not present and semiconductor substrate 2 is under fins 4, under portions of switching layer 110 and under portions of ILD 90.

A CMP removes the top portion of metal layer 116, a portion of top electrode 111 over a remaining portion of ILD 90, a top portion of switching layer 110 under the removed portion of top electrode 111, and a top portion of the remaining ILD 90. Using the processes as previously discussed in FIG. 15 (e.g., CMP, ILD deposit, selective ILD etch, metal layer deposition, and another CMP), one of contacts 115 is formed in metal layer 116. Contact 115, as depicted in FIG. 18, can provide an electrical connection to two ReRAM devices through metal layer 116 where each of the ReRAM devices on each of the first S/D 50 can be composed of switching layer 110, top electrode 111, and use first S/D 50 over fins 4 as a bottom electrode.

Semiconductor structure 1800 includes a metal layer 116 that connects the two ReRAM devices. Each ReRAM device surrounds one of the pair of first S/D 50 that are on two adjacent fins 4 of two adjacent transistor devices (e.g., FinFETs). As previously discussed, the two ReRAM devices in semiconductor structure 1800, composed of switching layer 110 and top electrode 111 on first S/D 50 of two adjacent FinFETS, can form current conducting filaments associated with the points of the faceted epitaxy of first S/D 50 during semiconductor device operation.

The ReRAM devices on first S/D 50 can be composed of a metal oxide (e.g., switching layer 110) that is between top electrode 111 and a bottom electrode (e.g., first S/D 50). The pointed ends of the bottom electrode (i.e., of first S/D 50) provides a higher electrical field that promotes formation of a current conducting filament in the switching layer 110. Using the pointed ends of the faceted, diamond shaped epitaxy forming first S/D 50 enhances the electrical field and localizes or locates the current conducting filament in switching layer 110 for each of the two ReRAM devices.

The two ReRAM devices, each on a different first S/D 50 (e.g., each on one of the two fins 4), face each other and are electrically connected by metal layer 116. In other embodiments, the two ReRAM devices are each formed on one of first S/D 50 on one end of each of fins 4 that is above gate stack 60. In this case, each of second S/D 50, on the other end of each of fins 4 below gate stack 60, provide a conventional connection to the other devices in the semiconductor chip.

Each of the two ReRAM devices are unipolar. For example, in the pair of ReRAM devices, one ReRAM device in the pair of ReRAM devices is on the first FinFET transistor and can represent positive values while the other ReRAM device on the second FinFET transistor can represent negative values. In other words, one unipolar ReRAM of the pair of ReRAMs can be used as a reference cell and the second unipolar ReRAM can be used for a weight update. In training of a deep neural network, a differential weight can represent both positive and negative values. In this way, the two ReRAM devices depicted in semiconductor structure 1800 that are electrically connected by metal layer 116 and above two adjacent fins 4 can provide a differential weight with the positive and negative values. The method of forming two ReRAM devices on fins of two adjacent FinFETs allows tightly scaled device architecture providing two transistors with two ReRAM devices. Using this tightly scaled two transistor/two ReRAM architecture improves an ability to train deep neural networks (e.g., provides a differential weight using two unipolar ReRAMs).

Figure 19:
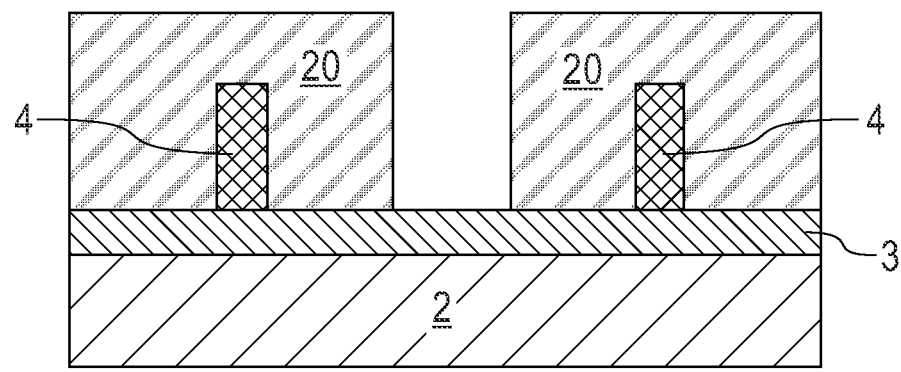
FIG. 19 is a cross section X1-X1 illustrating the semiconductor structure after source/drain formation according to an embodiment of the present invention of the present invention.

FIG. 19 is a cross section X1-X1 illustrating semiconductor structure 1900 after source/drain formation according to an embodiment of the present invention of the present invention. A second embodiment of the present invention provides another method of forming two ReRAM devices on two transistors (FinFETS). The method of forming the two ReRAM devices in the second embodiments begins using the same processes and semiconductor structures formed as depicted in FIGS. 1-6.

Semiconductor structure 1900 is essentially the same as semiconductor structure 600 depicted in FIG. 6 and can be formed with the same semiconductor processes discussed with respect to FIGS. 1-6. As depicted, FIG. 19 includes dummy gate 20 over each fin of a pair of fins 4, where oxide 3 is under fins 4 and under the bottom surface of each of dummy gate 20. Oxide 3 can be over semiconductor substrate 2. In some embodiments, oxide 3 is not present as depicted in FIG. 1B.

Figure 20:
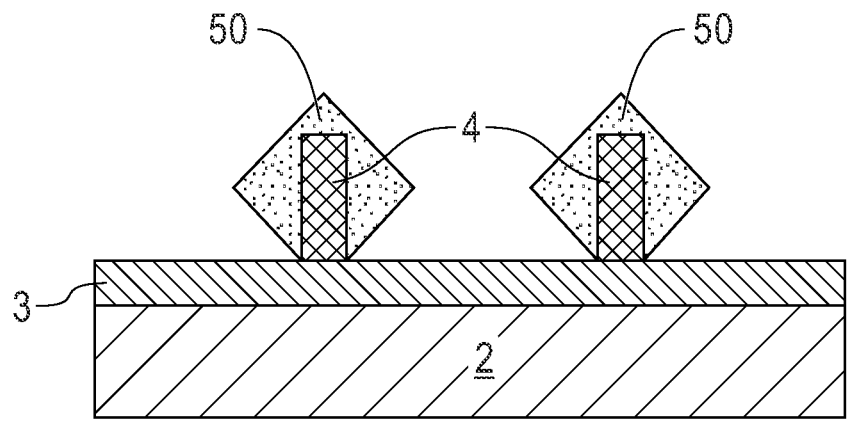
FIG. 20 is a cross section X2-X2 illustrating the semiconductor structure after the source/drain formation according to an embodiment of the present invention of the present invention.

FIG. 20 is a cross section X2-X2 illustrating semiconductor structure 2000 after source/drain formation according to an embodiment of the present invention. Semiconductor structure 2000 is essentially the same as semiconductor structure 700 depicted in FIG. 7 and can be formed with the same semiconductor processes discussed with respect to FIGS. 1-7. As depicted, FIG. 20 includes a pair of first S/D 50. In some embodiments, oxide 3 is not present.

As previously discussed with reference to FIG. 7, a faceted epitaxy forms the pair of first S/D 50, where the faceted epitaxy creates pointed tips or points in first S/D 50. The faceted source/drain material can be grown over the ends of fins 4 forming a diamond shaped structure of first S/D 50 over each of fins 4. As previously discussed, doping of each of source/drains can occur, where the doping for all source/drains (e.g., each of first S/D 50 and second S/D 50 depicted in FIG. 5) can be a same type of dopant and provides a same doping level. Using the faceted epitaxial growth process, as previously discussed, forming a faceted first S/D 50 creates pointed or cone-like features in the diamond shaped first S/D 50. The pointed features or points of the diamond epitaxy that forms each of the pair of first S/D 50 can enhance the electric field at the tips or points of each of the pair of first S/D 50 to control the formation or location of the current conducting filaments in the two ReRAM devices that are formed later in FIG. 25.

Figure 21:
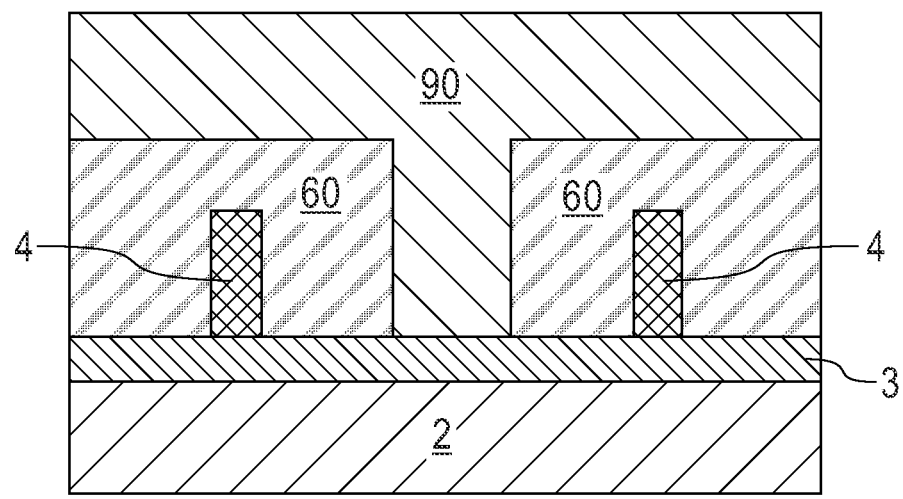
FIG. 21 is the cross section X-X1 illustrating the semiconductor structure after ILD deposition, dummy gate replacement, and ILD etch according to an embodiment of the present invention of the present invention.

FIG. 21 is the cross section X1-X1 illustrating semiconductor structure 2100 after dummy gate 20 replacement with gate stack 60, after ILD 90 deposition and after a selective etch of a portion of ILD 90 according to an embodiment of the present invention. As depicted, FIG. 21 includes ILD 90 over gate stack 60 and over a portion of oxide 3 which is over semiconductor substrate 2. Fins 4 are under gate stack 60 and above a portion of oxide 3. Semiconductor structure 2100 is essentially the same as semiconductor structure 900 depicted in FIG. 9. The method of forming semiconductor structure 2100 is essential the same as the method of forming semiconductor structure 900 previously discussed in detail with respect to FIG. 9.

Figure 22:
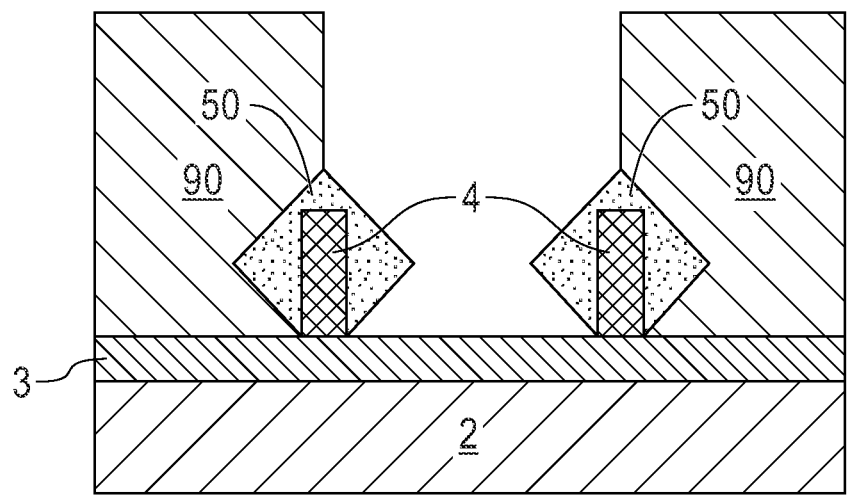
FIG. 22 is the cross section X2-X2 illustrating the semiconductor structure after the ILD deposition, the dummy gate replacement, and the ILD etch according to an embodiment of the present invention of the present invention.

FIG. 22 is the cross section X2-X2 illustrating semiconductor structure 2200 after ILD 90 deposition, after dummy gate 20 replacement with gate stack 60, and after a selective etch of a portion of ILD 90 according to an embodiment of the present invention. As depicted, FIG. 22 includes a portion of ILD 90 over a portion of each of the pair of first S/D 50 and over a portion of oxide 3, where a middle portion of oxide 3 is exposed and a portion each of the pair of first S/D 50 is exposed. Fins 4 can be on a portion of oxide 3 which may be over semiconductor substrate 2.

The deposition of a layer of ILD 90 and replacement of dummy gate 20 with gate stack 60 can occur with the same materials and processes discussed with reference to FIG. 10 except that a smaller portion of ILD 90 is removed in FIG. 22 than is removed in FIG. 10. The selective etch of ILD 90 is similar to the selective etch of semiconductor structure 1000 except that the portion of ILD 90 removed in semiconductor structure 2200 is less than the portion of ILD 90 removed in semiconductor structure 1000. As depicted in FIG. 22, ILD 90 is removed from approximately one half of first S/D 50 from facing sides of each of first S/D 50. Etching ILD 90 removes a portion of ILD 90 on adjacent or facing sides of first S/D 50. After etch, approximately, ILD 90 remains on the outside faces of first S/D 50 (e.g., ILD 90 remains on opposite or outside facing sides of first S/D 50). In other words, ILD 90 remains on about one half of first S/D 50. For example, as depicted in semiconductor structure 2200, the etch of ILD 90 can remove ILD 90 from approximately one pointed, top end of the diamond shaped of one of the pair of first S/D 50 to the other pointed, top end of the other first S/D 50 of the pair of first S/D 50.

Figure 23:
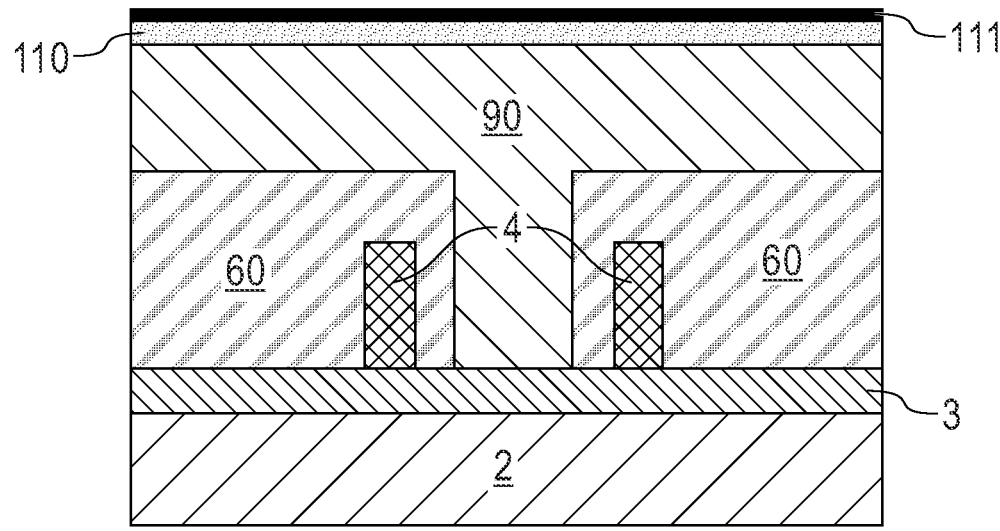
FIG. 23 is the cross section X1-X1 illustrating the semiconductor structure after depositing a switching layer and a top electrode material according to an embodiment of the present invention.

FIG. 23 is the cross section X1-X1 illustrating semiconductor structure 2300 after depositing switching layer 110 and top electrode 111 according to an embodiment of the present invention. As depicted, FIG. 22 includes the elements of FIG. 21 and top electrode 111 over switching layer 110 where switching layer 110 is deposited over ILD 90 of semiconductor structure 2200. The deposition processes, the materials and thicknesses of switching layer 110 and top electrode 111 are essentially the same the processes and the materials as discussed in detail with reference to FIG. 13. As depicted, FIG. 23 includes top electrode 111 deposited over switching layer 110 and switching layer 110 deposited over ILD 90 in semiconductor structure 2200 (e.g., with ILD 90 over gate stack 60 and oxide 3 that is above semiconductor substrate 2). However, as previously discussed, in some embodiments, oxide 3 is not present.

Figure 24:
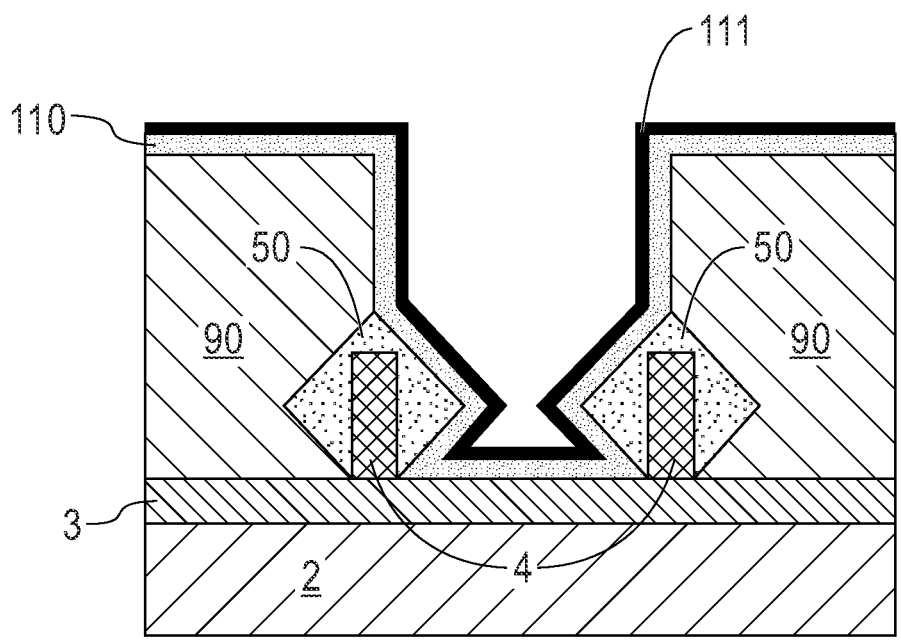
FIG. 24 is the cross section X2-X2 illustrating the semiconductor structure after depositing the switching layer and the top electrode material according to an embodiment of the present invention.

FIG. 24 is the cross section X2-X2 illustrating semiconductor structure 2400 after depositing switching layer 110 and top electrode 111 according to an embodiment of the present invention. As depicted, FIG. 24 includes the elements of FIG. 22 and top electrode 111 deposited over switching layer 110. Using the processes and materials previously discussed in detail with reference to FIG. 11, top electrode 111 can be deposited over switching layer 110.

However, in FIG. 24, switching layer 110 can be deposited over approximately one half each of first S/D 50 and over exposed portions of ILD 90 and over exposed portions of oxide 3. For example, using ALD, switching layer 110 deposits on the exposed adjacent facing surfaces of first S/D 50. Switching layer 110 can also be deposited on the exposed portion of oxide 3 between the pair of first S/D 50, and over the exposed surfaces of ILD 90. Unlike semiconductor structure 1100 depicted in FIG. 11, switching layer 110 does not deposit on the outward or opposing sides or surfaces of first S/D 50. In other words, switching layer 110 is deposited on approximately one half of each of first S/D 50.

Using the processes and materials as previously discussed with reference to FIGS. 11 and 12, a deposition of top electrode 111 on switching layer 110 can occur. Like switching layer 110, top electrode 111 deposits on adjacent or facing sides of first S/D 50 and does not deposit on the outward facing or opposing sides of first SD 50.

Figure 25:
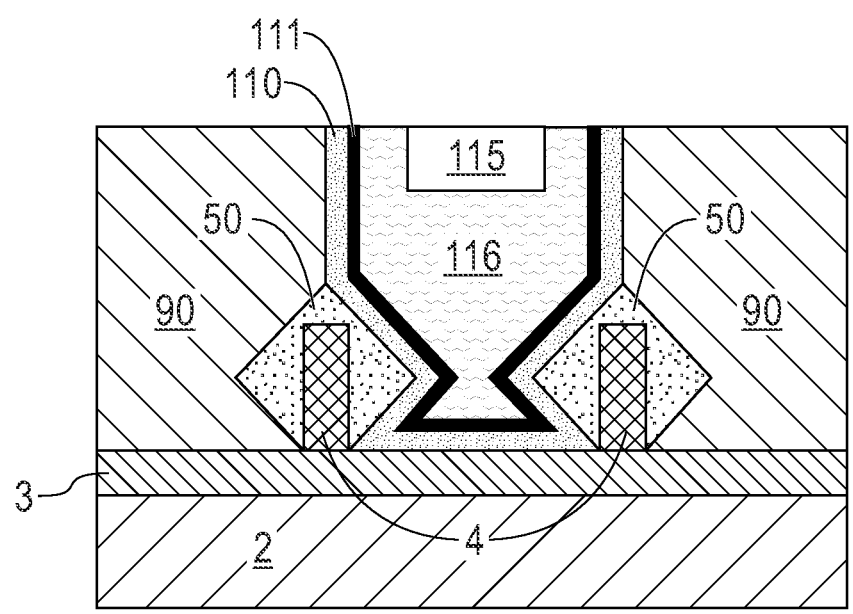
FIG. 25 is the cross section X2-X2 illustrating the semiconductor structure after depositing a metal layer and forming contacts according to an embodiment of the present invention.

FIG. 25 is the cross section X2-X2 illustrating semiconductor structure 2500 after a CMP, depositing metal layer 116 and forming contacts 115 according to an embodiment of the present invention. As depicted, FIG. 25 includes one of contacts 115 in metal layer 116 where metal layer 116 is surrounded by top electrode 111 and switching layer 110 is under top electrode 111. Metal layer 116 deposits between the adjacent facing sides of first S/D 50 electrically connecting a first ReRAM on first S/D 50 on the leftmost fin of fins 4 (e.g., on the leftmost FinFET) to the second ReRAM on first S/D on the rightmost fin of fins 4 (e.g., on the rightmost FinFET). ILD 90 can be over a portion of oxide 3 on semiconductor substrate 2 and surrounds exposed portions of switching layer 110 and an outside exposed portion of each S/D 50 (e.g., the exposed surfaces of S/D 50 that are facing outward and away from the each other). In some embodiments, oxide 3 is not present.

The formation of the contact of contacts 115 in metal layer 116 occurs using the known processes and the materials previously discussed in reference to FIG. 15 (e.g., ILD deposition, CMP, selective metal layer 116 etch, contact metal deposition, followed by a CMP to remove metal layer 116 over ILD 90).

As depicted, each of the two ReRAM devices can be composed of switching layer 110 and top electrode 111 that use first S/D 50 as a bottom electrode, where each of the two ReRAM devices reside on adjacent facing sides of first S/D 50 that are each on a fin of fins 4. The ReRAM devices formed with top electrode 111, switching layer 110 on first S/D 50 do not surround first S/D 50 like the ReRAM devices depicted in FIG. 18. The two electrically connected ReRAM devices in FIG. 25 can be formed on facing sides of the two first S/D 50 and therefore, cover approximately one half of each the two adjacent fins 4 each form a FinFET with a ReRAM adjacent faces of first S/D 50.

As depicted in FIG. 25, the ReRAM device can be formed inside portions or facing sides of first S/D 50 as opposed to the ReRAM devices formed in FIG. 18, where the ReRAM device composed of top electrode 111 and switching layer 110 extends on both sides of first S/D 50 (e.g., covers all sides of first S/D 50).

As previously discussed, one ReRAM device of the pair of ReRAM devices can be used as a reference cell and the other ReRAM device can be used a weight update. In this way, each unipolar ReRAM device can provide linear switching for a differential weight (e.g., as needed for improving deep neural network training).

While not depicted, the cross sections X1-X1 and M-M of semiconductor structures formed after depositing metal layer 116 and forming contacts 115, the cross section X1-X1 through gate stack 60 would be the same as semiconductor structure 1700 depicted in FIG. 17 and cross section M-M through the other pair of second S/D 50 would be the same as semiconductor structure 1600 of FIG. 16. As previously discussed, in some embodiments, oxide 3 is not present in FIG. 25, or cross sections X1-X1, X2-X2, and M-M associated with the semiconductor structures formed using the processes depicted in FIGS. 19-25.

While the present application has been particularly shown and described with respect to preferred embodiments thereof, it will be understood by those skilled in the art that the foregoing and other changes in forms and details may be made without departing from the spirit and scope of the present application. It is therefore intended that the present application will not be limited to the exact forms and details described and illustrated but fall within the scope of the appended claims.

What is claimed is:

1. A semiconductor structure, the structure comprising:
two adjacent fins on a substrate;
a gate stack on each of the two adjacent fins;
a first source/drain on a first end of each fin of the two adjacent fins and a second source/drain on a second end of each fin of the two adjacent fins;
a switching layer on at least the first source/drain on the first end of each fin of the two adjacent fins;
a top electrode on the switching layer; and
a metal material over the top electrode.

2. The semiconductor structure of claim 1, wherein the first source/drain on the first end of each fin of the two adjacent fins and the second source/drain on the second end of each fin of the two adjacent fins are formed with a faceted epitaxy.

3. The semiconductor structure of claim 2, wherein the faceted epitaxy creates a diamond shape with pointed ends for the first source/drain and the second source/drain.

4. The semiconductor structure of claim 2, wherein one or more points in the faceted epitaxy forming the first source/drain locates a position for a current conducting filament in the switching layer on at least the first source/drain on the first end of each fin of the two adjacent fins.

5. The semiconductor structure of claim 2, wherein the one or more points in the faceted epitaxy forming the first source/drain provide a higher electrical field at the one or more points of the faceted epitaxy source/drains.

6. The semiconductor structure of claim 1, wherein the top electrode on the switching layer above the first source/drain on a first fin of the two adjacent fins, the switching layer on the first source/drain on the first fin of the two adjacent fins, and the one first source/drain on the first fin of the two adjacent fins form a first resistive random-access memory device on a first transistor.

7. The semiconductor structure of claim 6, wherein the top electrode on the switching layer above the first source/drain on a second fin of the two adjacent fins, the switching layer on the first source/drain on the second fin of the two adjacent fins, and the first source/drain on the second fin of the two adjacent fins forms a second resistive random-access memory device on a second transistor.

8. The semiconductor structure of claim 7, wherein the first resistive random-access memory device is electrically connected to the second resistive memory device by the metal material over the top electrode.

9. The semiconductor structure of claim 8, wherein the first random-access memory device is on the first fin of a first transistor represents positive values and the second random-access memory device on the second fin of a second transistor represents negative values.

10. The semiconductor structure of claim 9, wherein the first random-access memory device is on the first fin of a first transistor represents the positive values and the second random-access memory device on the second fin of the second transistor represents the negative values providing a differential weight representing both the positive values and the negative values for training of a deep neural network.

11. The semiconductor structure of claim 1, further comprising:
a plurality of contacts, wherein each of the gate stacks on the two adjacent fins has an electrical contact on the gate stack; and wherein a third contact provides an electrical connection to the metal material over the top electrode.

12. A semiconductor structure, the structure comprising:
two adjacent fins on a substrate;
a first source/drain on a first end of each fin of the two adjacent fins and a second source/drain on a second end of each fin of the two adjacent fins;
a switching layer on at least one side of the first source/drain on the first end of each fin of the two adjacent fins;
a top electrode on the switching layer;
a metal material over the top electrode; and
a contact in the metal material.

13. The semiconductor structure of claim 12, wherein the at least one side of the first source/drain on the first end of each fin of the two adjacent fins is an adjacent facing side of each of the first source/drain on the first end of each fin of the two adjacent fins.

14. The semiconductor structure of claim 12, wherein the switching layer on the at least one side of the first source/drain on the first end of each fin of the two adjacent fins is on a portion of an oxide layer between the two adjacent fins, on facing sides of each of the first source/drain on each end of each fin of the two adjacent fins, and is on a portion of an interlayer dielectric that is above the first source/drain.

15. The semiconductor structure of claim 12, wherein the switching layer on the at least one side of the first source/drain on the first end of each fin of the two adjacent fins and the top electrode on the switching layer forms a pair of resistive random-access devices.

16. The semiconductor structure of claim 12, wherein one or more points in the faceted epitaxy forming the first source/drain provide a higher electrical field at the one or more points of the faceted epitaxy source/drains.

17. The semiconductor structure of claim 16, wherein the one or more points in the faceted epitaxy forming the first source/drain locates a position for a current conducting filament in the switching layer on at least the first source/drain on the first end of each fin of the two adjacent fins.

18. The semiconductor structure of claim 12, wherein the two adjacent fins on a substrate, further comprises a gate stack on each of the two adjacent fins, and wherein each gate stack is connected to a contact on each gate stack.

19. The semiconductor structure of claim 12, wherein the switching layer on the at least one side of the first source/drain on the first end of each fin of the two adjacent fins, further comprises the switching layer on two adjacent faces of the first source/drain on the first end of each fin of the two adjacent fins, and wherein the switching layer covers one half of each of the first source/drain on the first end of each fin of the two adjacent fins.

* * * * *